(12) United States Patent
Hsueh et al.

(10) Patent No.: US 10,483,845 B2
(45) Date of Patent: Nov. 19, 2019

(54) CHARGE PUMP HAVING LEVEL-SHIFTING MECHANISM

(71) Applicant: MEDIATEK INC., Hsin-Chu (TW)

(72) Inventors: Yu-Li Hsueh, Hsinchu (TW);
Chih-Hsien Shen, Hsinchu (TW);
Chao-Ching Hung, Hsinchu (TW);
Po-Chun Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/137,534

(22) Filed: Sep. 20, 2018

(65) Prior Publication Data

US 2019/0199207 A1 Jun. 27, 2019

Related U.S. Application Data

(60) Provisional application No. 62/610,315, filed on Dec. 26, 2017.

(51) Int. Cl.
*H03L 7/089* (2006.01)
*H02M 3/07* (2006.01)
*H03L 7/099* (2006.01)

(52) U.S. Cl.
CPC ............ *H02M 3/07* (2013.01); *H03L 7/0896* (2013.01); *H03L 7/099* (2013.01)

(58) Field of Classification Search
CPC ......... H02M 3/07; H03L 7/099; H03L 7/0896
USPC ........................................................ 327/157
See application file for complete search history.

(56) References Cited

U.S. PATENT DOCUMENTS

| 6,844,762 | B2 * | 1/2005 | Sanchez ............... H03K 4/023 327/157 |
|---|---|---|---|
| 9,331,569 | B1 | 5/2016 | Chiu et al. |
| 9,397,557 | B2 | 7/2016 | Chiu et al. |
| 2010/0073049 | A1 | 3/2010 | Tsai |
| 2012/0098579 | A1 | 4/2012 | Schober |

FOREIGN PATENT DOCUMENTS

| EP | 2 947 775 A1 | 11/2015 |
|---|---|---|
| TW | 200822559 | 5/2008 |
| TW | 201242238 A1 | 10/2012 |
| TW | 201315120 A1 | 4/2013 |

OTHER PUBLICATIONS

Abdelouahab Djemouai et al., New Frequency-Locked Loop Based on CMOS Frequency-to-Voltage Converter: Design and Implementation, IEEE Transactions on Circuits and Systems-II: Analog and Digital Signal Processing, vol. 48, No. 5, May 2001, pp. 441-449, XP002247796.

* cited by examiner

*Primary Examiner* — Kenneth B Wells
(74) *Attorney, Agent, or Firm* — Winston Hsu

(57) ABSTRACT

The present invention provides a charge pump including a pull-up circuit for selectively providing charges to an output terminal of the charge pump, and the pull-up circuit comprises a transistor, a capacitor and a switched-capacitor circuit, wherein the capacitor is coupled to an electrode of the transistor, and the switched-capacitor circuit is coupled between a supply voltage and another electrode of the transistor. The switched-capacitor circuit is configured to boost a voltage of the other electrode of the transistor to charge the capacitor via the transistor, then the capacitor and the output terminal of the charge pump are under a charge distribution operation.

16 Claims, 8 Drawing Sheets

CHARGE PUMP HAVING LEVEL-SHIFTING MECHANISM

CROSS REFERENCE TO RELATED APPLICATIONS

This application claims the priority of U.S. Provisional Application No. 62/610,315, filed on Dec. 26, 2017, which is included herein by reference in its entirety.

BACKGROUND

A conventional charge pump generally includes two current sources for charging and discharging an output node to generate a suitable control voltage to a following voltage-controlled oscillator (VCO) to generate an output clock signal. The two current sources are generally implemented by a P-type transistor and an N-type transistor, respectively, and drain-to-source voltages of the P-type transistor or the N-type transistor are generally designed larger to have lower noise. However, the larger drain-to-source voltages mean that the control voltage has a narrow range. If the charge pump is applied in a low-voltage application (i.e. low supply voltage), this narrow headroom issue may become worse, and the functions and noise of the charge pump may be worsened.

SUMMARY

It is therefore an objective of the present invention to provide a charge pump which allows a large range for the control voltage and has low noise, to solve the above-mentioned problems.

According to one embodiment of the present invention, a charge pump includes a pull-up circuit for selectively providing charges to an output terminal of the charge pump, and the pull-up circuit comprises a transistor, a capacitor and a switched-capacitor circuit, wherein the capacitor is coupled to an electrode of the transistor, and the switched-capacitor circuit is coupled between a supply voltage and another electrode of the transistor. The switched-capacitor circuit is configured to boost a voltage of the other electrode of the transistor to charge the capacitor via the transistor, then the capacitor and the output terminal of the charge pump are under a charge distribution operation.

According to another embodiment of the present invention, a phase-locked loop includes a phase detector, a charge pump, a voltage-controlled oscillator and a frequency divider. In the operations of the phase-locked loop, the phase detector is configured to receive an input signal and a feedback signal to generate a detection result, the charge pump is configured to generate a control signal according to the detection result, the voltage-controlled oscillator is configured to generate an output clock signal according to the control signal, and the frequency divider is configured to frequency-divide the output clock signal to generate the feedback signal. In one embodiment, the charge pump includes a pull-up circuit for selectively providing charges to an output terminal of the charge pump, and the pull-up circuit comprises a transistor, a capacitor and a switched-capacitor circuit, wherein the capacitor is coupled to an electrode of the transistor, and the switched-capacitor circuit is coupled between a supply voltage and another electrode of the transistor. The switched-capacitor circuit is configured to boost a voltage of the other electrode of the transistor to charge the capacitor via the transistor, then the capacitor and the output terminal of the charge pump are under a charge distribution operation.

According to another embodiment of the present invention, a charge pump includes a pull-up circuit for selectively providing charges to an output terminal of the charge pump, and the pull-up circuit comprises a transistor, a capacitor, a switched-capacitor circuit and a switch, wherein the capacitor is coupled to an electrode of the transistor, the switched-capacitor circuit is coupled between a supply voltage and another electrode of the transistor, and the switch is coupled between the first electrode of the first transistor and the output terminal of the charge pump. When the pull-up circuit operates in a first phase, the switched-capacitor circuit is controlled to charge the first capacitor via the first transistor, and the switch is controlled to disconnect the first electrode of the first transistor from the output terminal of the charge pump. When the pull-up circuit operates in a second phase, the switched-capacitor circuit is controlled to be disconnected from the second electrode of the first transistor, and the switch is controlled to connect the first electrode of the first transistor to the output terminal of the charge pump.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
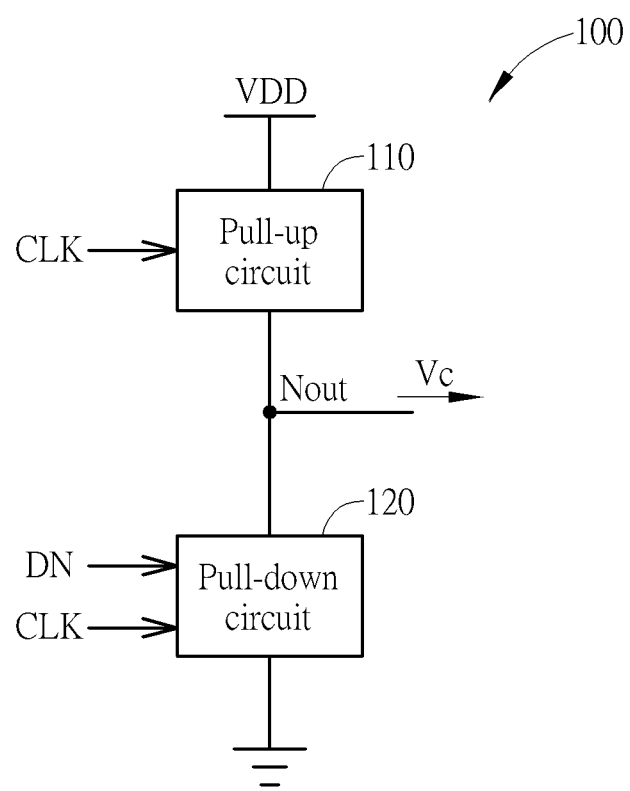
FIG. 1 is a diagram illustrating a charge pump according to one embodiment of the present invention.

FIG. 1 is a diagram illustrating a charge pump 100 according to one embodiment of the present invention. As shown in FIG. 1, the charge pump 100 comprises a pull-up circuit 110 and a pull-down circuit 120. In the operations of the charge pump 100, the pull-up circuit 110 is configured to receive a clock signal CLK to selectively charge an output terminal Nout of the charge pump 100, and the pull-down circuit 120 is configured to receive a control signal DN to selectively discharge the output terminal Nout of the charge pump 100, so as to generate a control voltage Vc to a following circuit such as a VCO.

Figure 2:
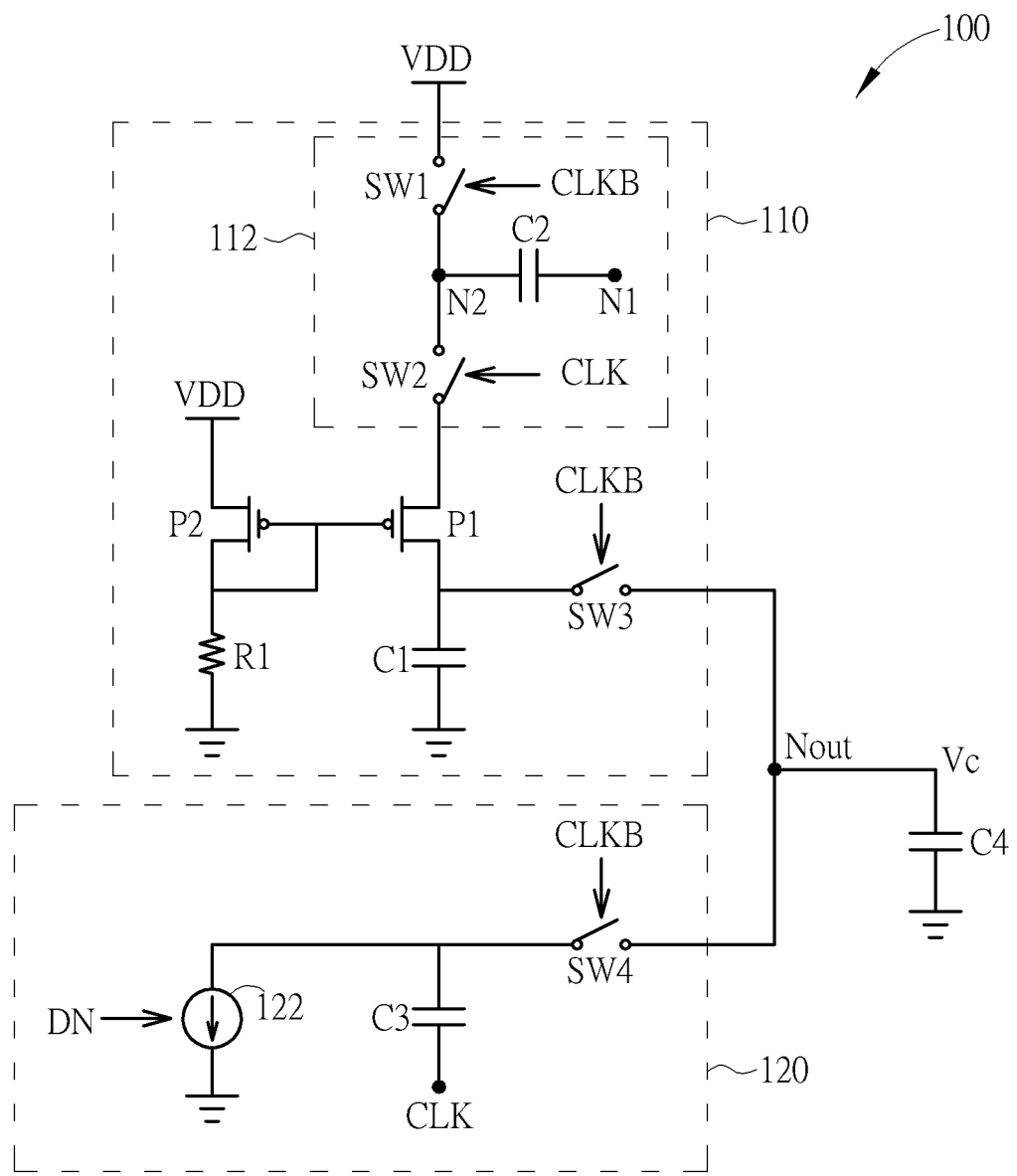
FIG. 2 shows the detailed structures of the charge pump according to one embodiment of the present invention.

FIG. 2 shows the detailed structures of the charge pump 100 according to one embodiment of the present invention. As shown in FIG. 2, the pull-up circuit 100 comprises two P-type transistors P1 and P2, one resistor R1 coupled between a drain electrode of the P-type transistor P2 and a ground voltage, a switched-capacitor circuit 112, a capacitor C1 and a switch SW3, where a gate electrode of the P-type transistor P1 is coupled to a gate electrode of the P-type transistor P2, the switched-capacitor circuit 112 is coupled between a supply voltage VDD and a source electrode of the P-type transistor P1, the capacitor C1 is coupled between a drain electrode of the P-type transistor P1 and the ground voltage, and the switch SW3 is coupled between the capacitor C1 and the output terminal Nout. In addition, the switched-capacitor circuit 112 comprises two switches SW1 and SW2, and a capacitor C2, where a first node N1 of the capacitor C2 is connected to the clock signal CLK, the switch SW1 is coupled between the supply voltage VDD and a second node N2 of the capacitor C2, and the switch SW2 is coupled between the source electrode of the P-type transistor P1 and the second node N2 of the capacitor C2. In the embodiment shown in FIG. 2, the switch SW2 is controlled by the clock signal CLK, and the switches SW1 and SW3 are controlled by an inverted clock signal CLKB.

The pull-down circuit 120 comprises a current source 122, a capacitor C3 and a switch SW4, where one node of the capacitor C3 is coupled to the clock signal CLK, a current source 122 controlled by the control signal DN is coupled to the other node of the capacitor C3, and the switch SW4 controlled by the inverted clock signal CLKB is coupled between the other node of the capacitor C3 and the output terminal Nout.

Figure 3:
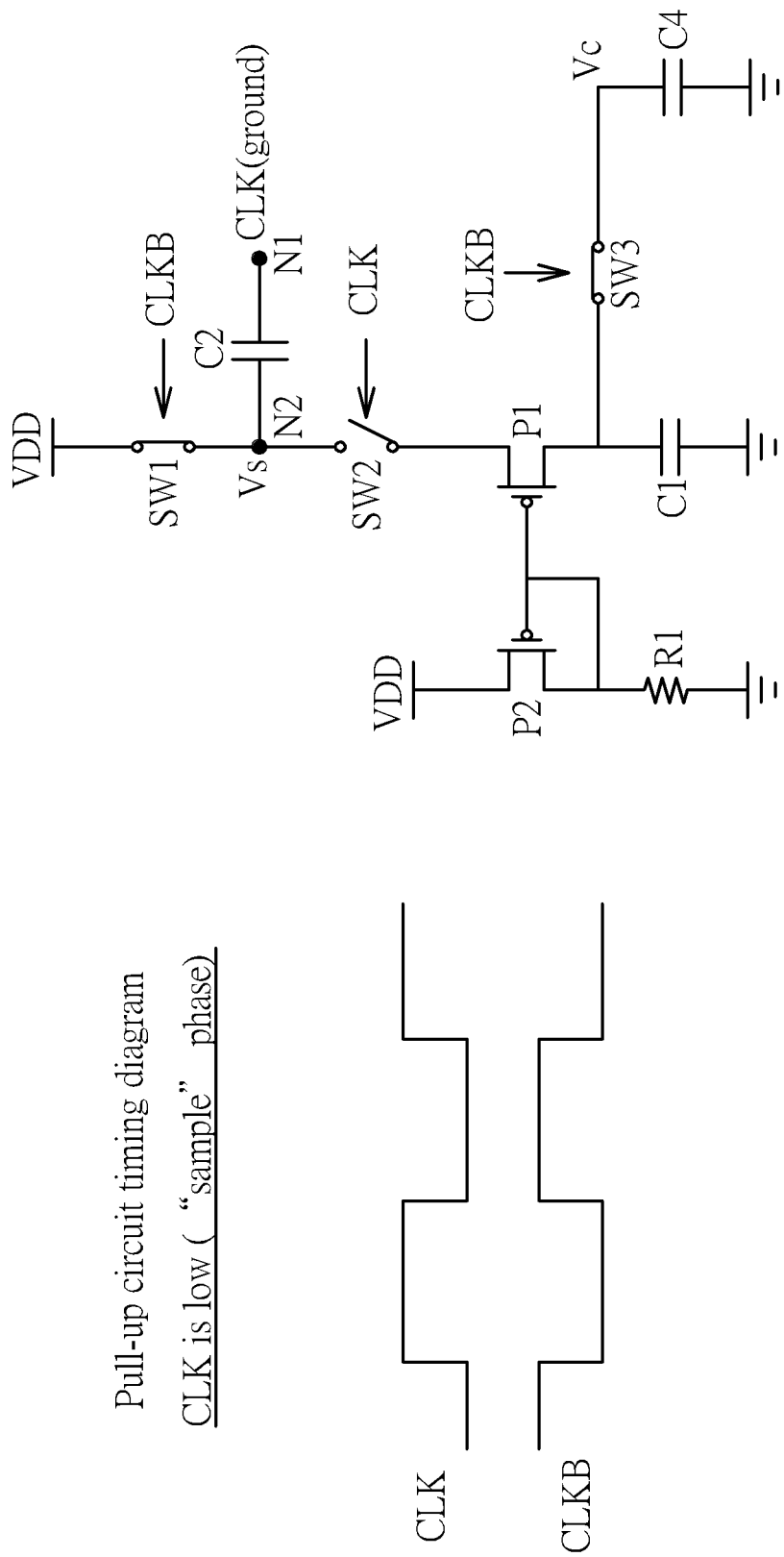
FIG. 3 is a diagram illustrating a sample phase of the pull-up circuit according to one embodiment of the present invention.
Figure 4:
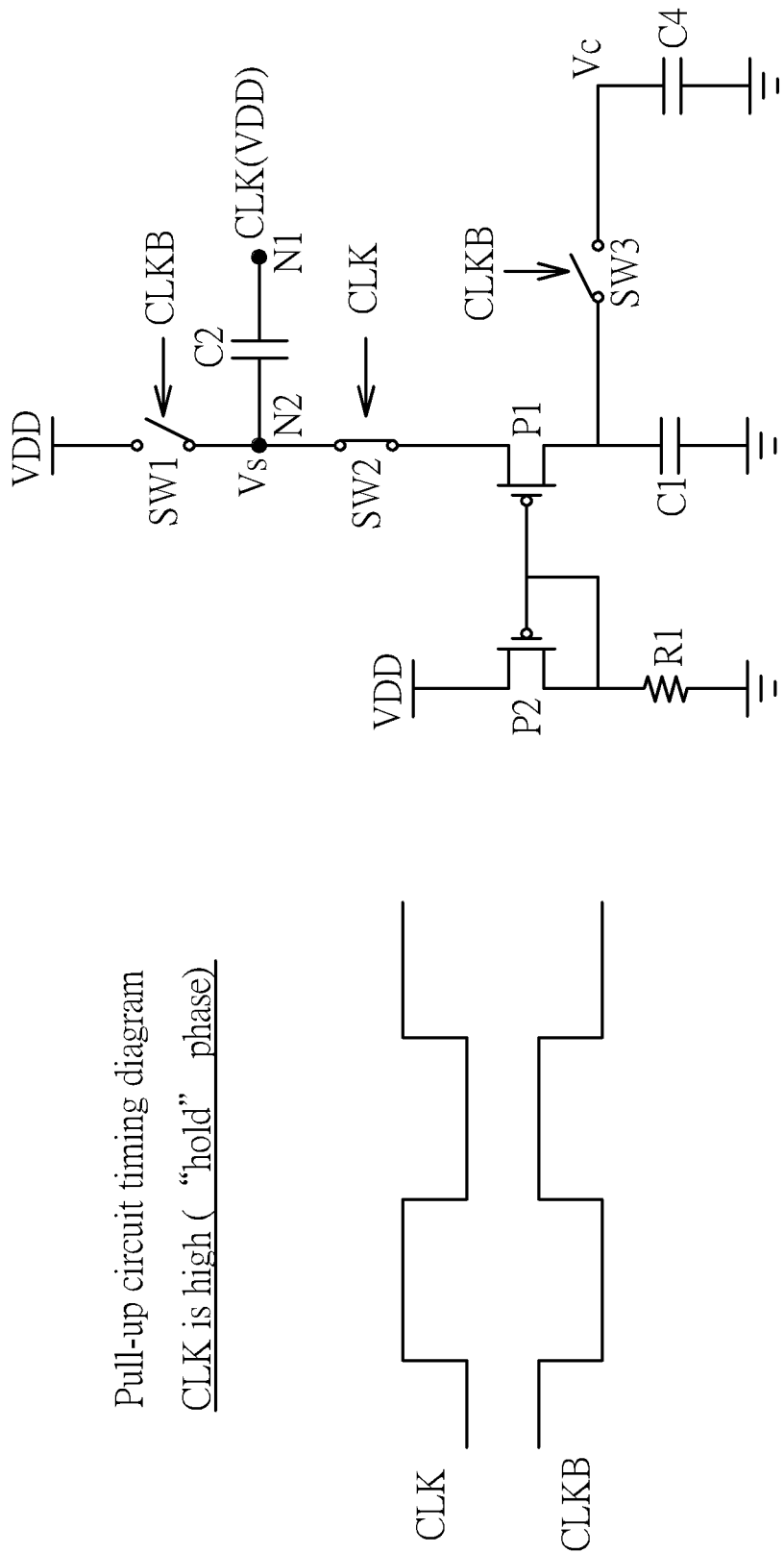
FIG. 4 is a diagram illustrating a hold phase of the pull-up circuit according to one embodiment of the present invention.

FIG. 3 is a diagram illustrating a sample phase of the pull-up circuit 110 according to one embodiment of the present invention, and FIG. 4 is a diagram illustrating a hold phase of the pull-up circuit 110 according to one embodiment of the present invention. As shown in FIG. 3, when a level of the clock signal is low (e.g. ground voltage), the switch SW1 is controlled to connect the supply voltage VDD to the node N2, the switch SW2 is controlled to disconnect the node N2 from the source electrode of the P-type transistor P1, and the switch SW3 is controlled to connect the capacitor C1 to the capacitor C4. In the sample phase shown in FIG. 3, the capacitor C1 is connected to the capacitor C4 to perform a charge re-distribution, that is the charges at the capacitor C1 may flow to the capacitor C4 until their voltages are equal. In addition, in the sample phase of the pull-up circuit 110, the charge re-distribution path (i.e. the capacitor C1) is not electrically connected to any supply voltage VDD, so charge re-distribution path and the control voltage Vc will have lower noise because the supply voltage VDD generally has noise and spur.

Figure 5:
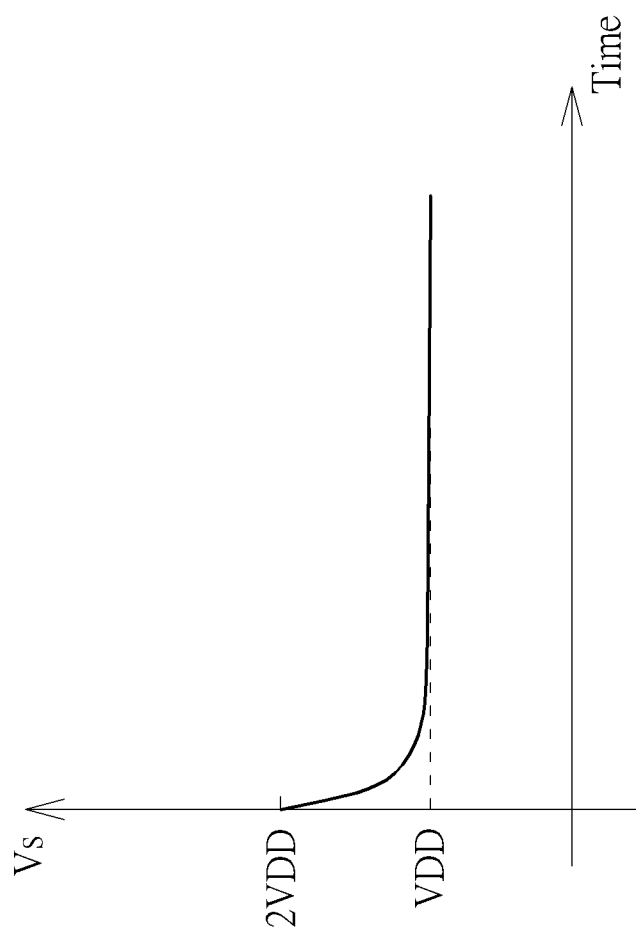
FIG. 5 shows a voltage of the node N2 according to one embodiment of the present invention.

When the level of the clock signal CLK is high (e.g. VDD), the pull-up circuit 110 is in the hold phase, and the switch SW1 is controlled to disconnect the supply voltage VDD from the node N2, the switch SW2 is controlled to connect the node N2 to the source electrode of the P-type transistor P1, and the switch SW3 is controlled to disconnect the capacitor C1 from the capacitor C4. Referring to FIG. 4 and FIG. 5 together, FIG. 5 shows a voltage Vs of the node N2 according to one embodiment of the present invention. In the sample period shown in FIG. 3, the voltage Vs of the node N2 is equal to VDD because the switch SW1 is controlled to connect the supply voltage VDD to the node N2. Therefore, when the clock signal CLK goes high and the pull-up circuit 110 enters the hold phase shown in FIG. 4, the voltage Vs is immediately boosted to "2*VDD" because the node N1 has the voltage VDD and the cross-voltage of the capacitor C2 cannot immediately change. Then, the node N2 charges the capacitor C1 via the switch SW2 and the P-type transistor P1 until the voltage Vs is equal to VDD. In the hold phase of the pull-up circuit 110, because the voltage Vs of the node N2 is boosted to the "2*VDD" at the beginning of the hold phase, the charges can be completely transported to capacitor C1 due to the high voltage Vs. In addition, the P-type transistors P1 and P2 form a current mirror, and the P-type transistor P2 is controlled to be barely off (i.e. a gate-to-source voltage of the P-type transistor P2 is close to a threshold voltage), so the voltage Vs can be precisely controlled to have the voltage VDD at the end of the hold phase. Furthermore, because the charge generation at the node N2 is not dependent on any transistor, the charge generation will not be influenced by the threshold voltage or other properties of the transistor, and the charge generation virtually consumes zero headroom since the Vdsat (i.e. a difference between a gate-source voltage and a threshold voltage) of the transistor P1 is virtually zero.

Figure 6:
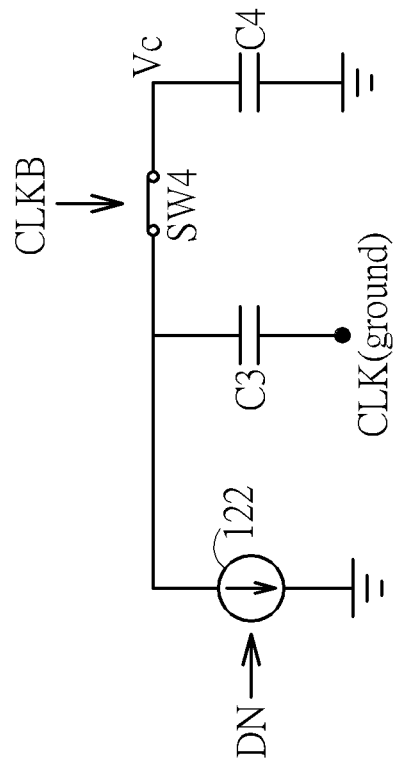
FIG. 6 is a diagram illustrating a sample phase of the pull-down circuit according to one embodiment of the present invention.
Figure 6:
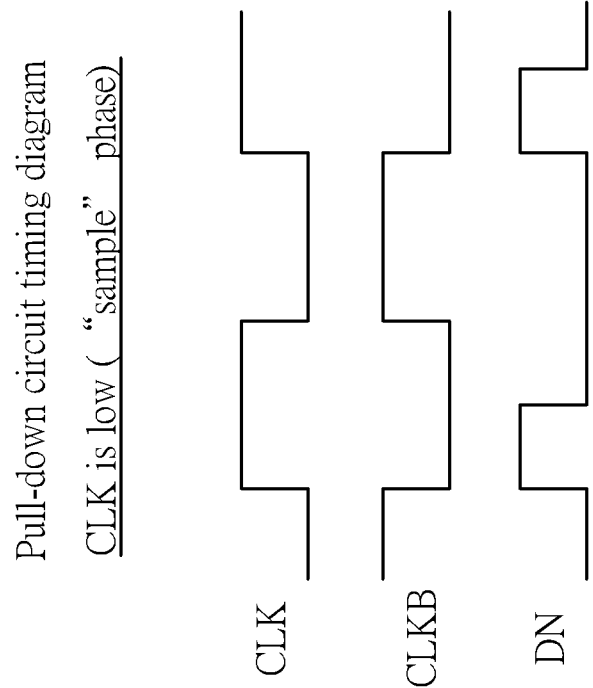
Figure 7:
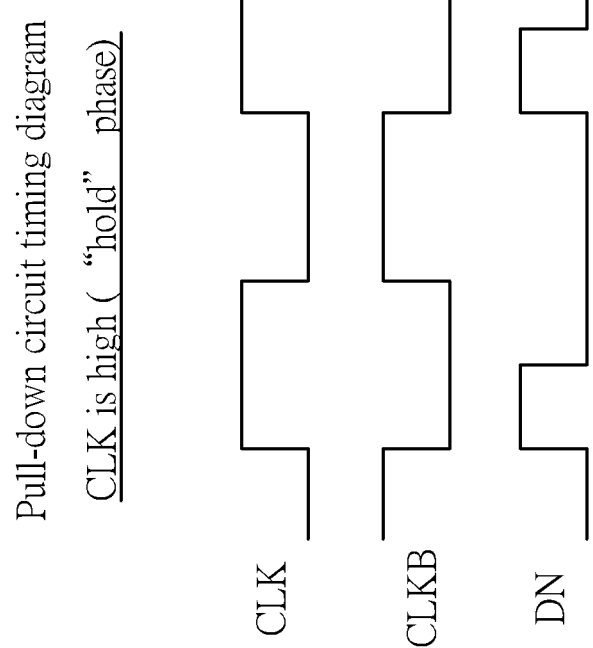
FIG. 7 is a diagram illustrating a hold phase of the pull-down circuit according to one embodiment of the present invention.

FIG. 6 is a diagram illustrating a sample phase of the pull-down circuit 120 according to one embodiment of the present invention, and FIG. 7 is a diagram illustrating a hold phase of the pull-down circuit 120 according to one embodiment of the present invention. As shown in FIG. 6, when the level of the clock signal is low (e.g. ground voltage), the current source 122 is disabled, and the switch SW4 is controlled to connect the capacitor C3 to the capacitor C4. In the sample phase shown in FIG. 6, the capacitor C3 is connected to the capacitor C4 to perform the charge re-distribution, that is the charges at the capacitor C3 may flow to the capacitor C4 until their voltages are equal. In addition, in the sample phase of the pull-down circuit 120, the charge re-distribution path (i.e. the capacitor C3) is not electrically connected to any supply voltage VDD, so charge re-distribution path and the control voltage Vc will have lower noise because the supply voltage VDD generally have noise and spur.

When the level of the clock signal is high (e.g. VDD), the pull-down circuit 120 is in the hold phase, the switch SW4 is controlled to disconnect the capacitor C3 from the capacitor C4. In the hold phase shown in FIG. 7, the voltage Vs' of the upper node of the capacitor C3 is equal to "Vc+VDD", wherein the value of the control voltage Vc corresponds to the previous sample phase. Therefore, when the clock signal CLK goes high and the pull-down circuit 120 enters the hold phase, the voltage Vs' is immediately boosted to "Vc+VDD" because the lower node of the capacitor C3 has the voltage VDD and the cross-voltage of the capacitor C3 cannot immediately change. In the hold phase of the pull-down circuit 120, because the voltage Vs' of the upper node of the capacitor C3 is boosted to "Vc+VDD", the current source 122 may have large headroom and the noise of the current source 122 can be effectively reduced, and the control voltage Vc may have larger range.

Briefly summarizing the embodiments shown in FIG. 2-7, because the pull-up circuit 110 and the pull-down circuit 120 employ the level-shifting techniques (e.g. the switched-capacitor circuit 112), the control voltage Vc has a larger control range (e.g. ground to VDD), and the charge generation of the pull-up circuit 110 virtually consumes zero headroom, and more headroom can be reserved for the current source 122 of the pull-down circuit 120 to reduce the noise. In addition, because the charge generation of the pull-up circuit 110 is based on the current-mirror-like topology, the voltage supply's noise can be blocked.

Figure 8:
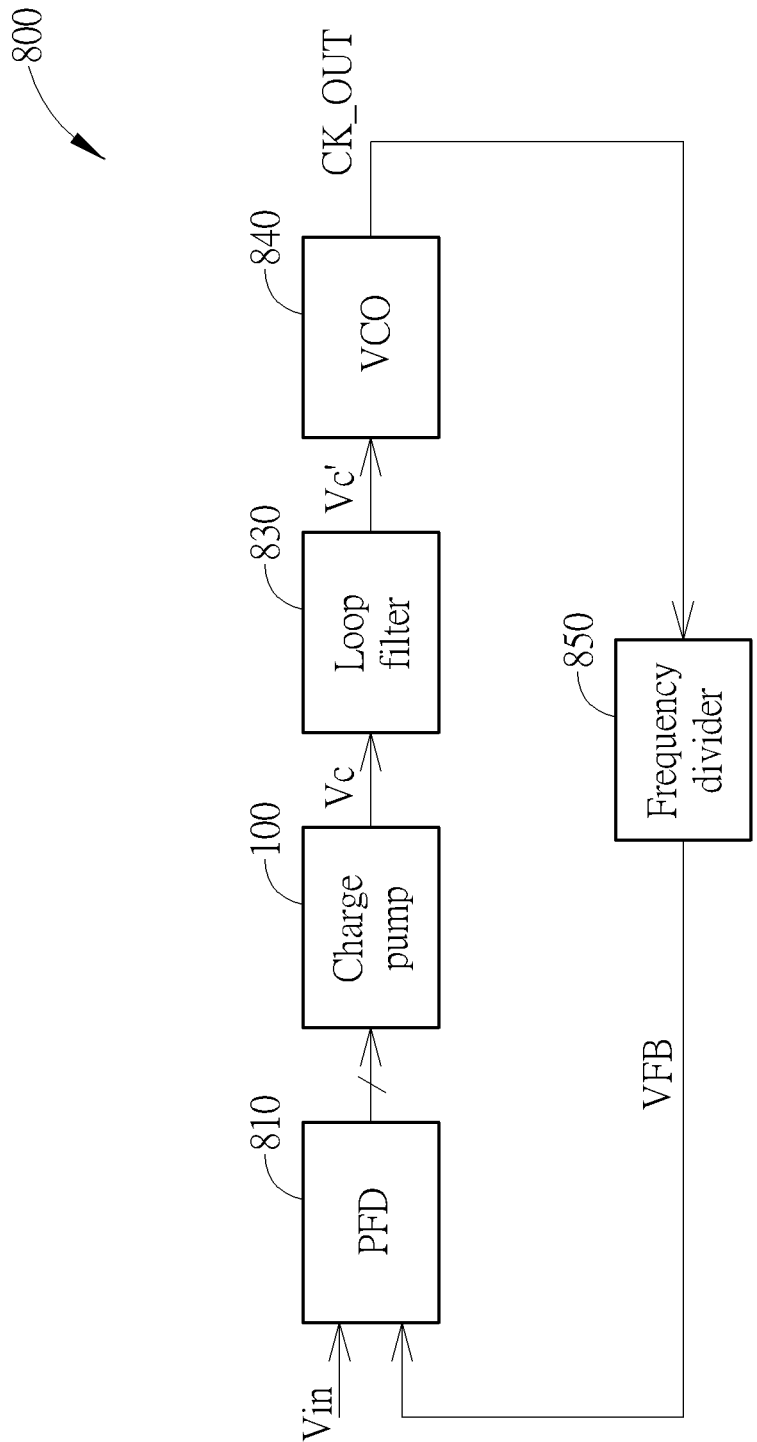
FIG. 8 is a diagram illustrating a phase-locked loop according to one embodiment of the present invention.

In one embodiment, the charge pump 100 can be applied in a phase-locked loop 800 as shown in FIG. 8. In FIG. 8, the phase-locked loop 800 comprises a phase-frequency detector 810, the charge pump 100, a loop filter 830, a VCO 840 and a frequency divider 850. In the operations of the phase-locked loop 800, the phase-frequency detector 810 receives an input signal (reference clock signal) Vin and a feedback signal VFB to generate a detection result, the charge pump 100 generates the control voltage Vc according to the detection result, the loop filter 830 filters the control voltage Vc to generate a filtered control voltage Vc', the VCO 840 generates an output clock signal CK_OUT according to the filtered control voltage Vc', and the frequency divider 850 frequency-divides the output clock signal CK_OUT to generate the feedback signal VFB.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge pump, comprising:
a pull-up circuit, for selectively providing charges to an output terminal of the charge pump, wherein the pull-up circuit comprises:
a first transistor;
a first capacitor, coupled to one electrode of the first transistor; and
a switched-capacitor circuit, coupled between a supply voltage and another electrode of the first transistor, for boosting a voltage of the other electrode of the first transistor to charge the first capacitor via the first transistor, then the first capacitor and the output terminal of the charge pump are under a charge distribution operation;
wherein when the first capacitor and the output terminal of the charge pump are under the charge distribution operation, the first capacitor is electrically disconnected from the supply voltage.

2. A charge pump, comprising:
a pull-up circuit, for selectively providing charges to an output terminal of the charge pump, wherein the pull-up circuit comprises:
a first transistor;
a first capacitor, coupled to one electrode of the first transistor; and
a switched-capacitor circuit, coupled between a supply voltage and another electrode of the first transistor, for boosting a voltage of the other electrode of the first transistor to charge the first capacitor via the first transistor, then the first capacitor and the output terminal of the charge pump are under a charge distribution operation;
wherein the first transistor is a P-type transistor, and the switched-capacitor circuit comprises:
a second capacitor, wherein a first node of the second capacitor is coupled to a first clock signal;
a first switch, coupled between the supply voltage and a second node of the second capacitor, wherein the first switch is controlled by a second clock signal to connect or disconnect the supply voltage to the second node of the second capacitor, wherein phases of the second clock signal and the first clock signal are inverted; and
a second switch, coupled between the second node of the second capacitor and a source electrode of the first transistor, wherein the second switch is controlled by the first clock signal to connect or disconnect the second capacitor to the source electrode of the first transistor.

3. The charge pump of claim 2, further comprising:
a third switch, coupled between a drain electrode of the first transistor and the output terminal of the charge pump, wherein the third switch is controlled by the second clock signal to connect or disconnect the drain electrode of the first transistor to the output terminal of the charge pump.

4. A charge pump, comprising:
a pull-up circuit, for selectively providing charges to an output terminal of the charge pump, wherein the pull-up circuit comprises:
a first transistor;
a first capacitor, coupled to one electrode of the first transistor; and
a switched-capacitor circuit, coupled between a supply voltage and another electrode of the first transistor, for boosting a voltage of the other electrode of the first transistor to charge the first capacitor via the first transistor, then the first capacitor and the output terminal of the charge pump are under a charge distribution operation;
wherein the pull-up circuit further comprises:
a second transistor, wherein a gate electrode of the second transistor is coupled to a gate electrode of the first transistor, and a first electrode of the second transistor is coupled to the supply voltage; and
a resistor, coupled between a second electrode of the second transistor and a ground voltage, and the second electrode of the second transistor is also coupled to its gate electrode.

5. The charge pump of claim 4, wherein the first transistor and the second transistor are P-type transistors, and the second transistor is barely off when the switched-capacitor circuit boosts the voltage of the other electrode of the first transistor to charge the first capacitor via the first transistor.

6. A charge pump, comprising:
a pull-up circuit, for selectively providing charges to an output terminal of the charge pump, wherein the pull-up circuit comprises:
a first transistor;
a first capacitor, coupled to one electrode of the first transistor; and
a switched-capacitor circuit, coupled between a supply voltage and another electrode of the first transistor, for boosting a voltage of the other electrode of the first transistor to charge the first capacitor via the first transistor, then the first capacitor and the output terminal of the charge pump are under a charge distribution operation;
a pull-down circuit, comprising:
a current source, coupled to the output terminal of the charge pump via a switch, for selectively discharging the output terminal of the charge pump;

wherein the pull-down circuit further comprises:
a third capacitor, wherein a first node of the third capacitor is coupled to a first clock signal, and a second node of the third capacitor is coupled to the current source;
wherein the switch is controlled by a second clock signal to connect or disconnect the current source to the output terminal of the charge pump, and the phases of the second clock signal and the first clock signal are inverted.

7. A phase-locked loop, comprising:
a phase detector, for receiving an input signal and a feedback signal to generate a detection result;
a charge pump, for generating a control signal according to the detection result, wherein the charge pump comprises:
a pull-up circuit, for selectively providing charges to an output terminal of the charge pump, wherein the pull-up circuit comprises:
a first transistor;
a first capacitor, coupled to one electrode of the first transistor; and
a switched-capacitor circuit, coupled between a supply voltage another electrode of the first transistor, for boosting a voltage of the other electrode of the first transistor to charge the first capacitor via the first transistor, then the first capacitor and the output terminal of the charge pump are under a charge distribution operation; wherein when the first capacitor and the output terminal of the charge pump are under the charge distribution operation, the first capacitor is electrically disconnected from the supply voltage; and
a voltage-controlled oscillator, for generating an output clock signal according to the control signal; and
a frequency divider, for frequency-dividing the output clock signal to generate the feedback signal.

8. The phase-locked loop of claim 7, wherein the first transistor is a P-type transistor, and the switched-capacitor circuit comprises:
a second capacitor, wherein a first node of the second capacitor is coupled to a first clock signal;
a first switch, coupled between the supply voltage and a second node of the second capacitor, wherein the first switch is controlled by a second clock signal to connect or disconnect the supply voltage to the second node of the second capacitor, wherein phases of the second clock signal and the first clock signal are inverted; and
a second switch, coupled between the second node of the second capacitor and a source electrode of the first transistor, wherein the second switch is controlled by the first clock signal to connect or disconnect the second capacitor to the source electrode of the first transistor.

9. The phase-locked loop of claim 8, further comprising:
a third switch, coupled between a drain electrode of the first transistor and the output terminal of the charge pump, wherein the third switch is controlled by the second clock signal to connect or disconnect the drain electrode of the first transistor to the output terminal of the charge pump.

10. The phase-locked loop of claim 7, wherein the pull-up circuit further comprises:
a second transistor, wherein a gate electrode of the second transistor is coupled to a gate electrode of the first transistor, and a first electrode of the second transistor is coupled to the supply voltage; and
a resistor, coupled between a second electrode of the second transistor and a ground voltage, and the second electrode of the second transistor is also coupled to its gate electrode.

11. The phase-locked loop of claim 10, wherein the first transistor and the second transistor are P-type transistors, and the second transistor is barely off when the switched-capacitor circuit boosts the voltage of the other electrode of the first transistor to charge the first capacitor via the first transistor.

12. The phase-locked loop of claim 7, further comprising:
a pull-down circuit, comprising:
a current source, coupled to the output terminal of the charge pump via a switch, for selectively discharging the output terminal of the charge pump.

13. The phase-locked loop of claim 12, wherein the pull-down circuit further comprises:
a third capacitor, wherein a first node of the third capacitor is coupled to a first clock signal, and a second node of the third capacitor is coupled to the current source;
wherein the switch is controlled by a second clock signal to connect or disconnect the current source to the output terminal of the charge pump, and the phases of the second clock signal and the first clock signal are inverted.

14. A charge pump, comprising:
a pull-up circuit, for selectively providing charges to an output terminal of the charge pump, wherein the pull-up circuit comprises:
a first transistor;
a first capacitor, coupled to a first electrode of the first transistor; and
a switched-capacitor circuit, coupled between a supply voltage and a second electrode of the transistor,
a switch, coupled between the first electrode of the first transistor and the output terminal of the charge pump;
wherein when the pull-up circuit operates in a first phase, the switched-capacitor circuit is controlled to charge the first capacitor via the first transistor, and the switch is controlled to disconnect the first electrode of the first transistor from the output terminal of the charge pump; and when the pull-up circuit operates in a second phase, the switched-capacitor circuit is controlled to be disconnected from the second electrode of the first transistor, and the switch is controlled to connect the first electrode of the first transistor to the output terminal of the charge pump.

15. The charge pump of claim 14, wherein the switch is a third switch, the first transistor is a P-type transistor, and the switched-capacitor circuit comprises:
a second capacitor, wherein a first node of the second capacitor is coupled to a first clock signal;
a first switch, coupled between the supply voltage and a second node of the second capacitor, wherein the first switch is controlled by a second clock signal to connect or disconnect the supply voltage to the second node of the second capacitor, wherein phases of the second clock signal and the first clock signal are inverted; and
a second switch, coupled between the second node of the second capacitor and a source electrode of the first transistor, wherein the second switch is controlled by the first clock signal to connect or disconnect the second capacitor to the source electrode of the first transistor.

16. The charge pump of claim 15, wherein the third switch is controlled by the second clock signal to connect or disconnect the drain electrode of the first transistor to the output terminal of the charge pump.

* * * * *